United States Patent [19]

Küyel

[11] 4,282,267
[45] Aug. 4, 1981

[54] METHODS AND APPARATUS FOR GENERATING PLASMAS

[75] Inventor: Birol Küyel, Hopewell, N.J.

[73] Assignee: Western Electric Co., Inc., New York, N.Y.

[21] Appl. No.: 127,296

[22] Filed: Mar. 5, 1980

Related U.S. Application Data

[63] Continuation-in-part of Ser. No. 77,220, Sep. 20, 1979, abandoned.

[51] Int. Cl.³ .............................................. C23C 11/08
[52] U.S. Cl. ................................... 427/38; 427/45.1; 427/94; 427/95
[58] Field of Search ...................... 427/38, 39, 40, 45, 427/94, 95, 93; 204/164, 177, 193; 118/50.1, 620; 315/111.2

[56] References Cited

U.S. PATENT DOCUMENTS

| | | | |
|---|---|---|---|
| 3,007,072 | 10/1961 | McGinn et al. | 315/111.1 |
| 3,287,243 | 11/1966 | Ligenza | 427/38 |
| 3,370,198 | 2/1968 | Rogers et al. | 315/111.2 |
| 3,866,398 | 2/1975 | Vernon et al. | 156/643 |
| 3,916,034 | 10/1975 | Tsuchimoto et al. | 427/38 |
| 4,033,287 | 7/1977 | Alexander et al. | 118/723 |
| 4,066,037 | 1/1978 | Jacob | 427/39 |

OTHER PUBLICATIONS

Shiba Gaki et al. "Symposium of the Electro Chemical Society", Abstract No. 152, pp. 416–418, (1977).

Primary Examiner—John H. Newsome
Attorney, Agent, or Firm—B. W. Sheffield; A. M. Tobia

[57] ABSTRACT

An RF-excited radial-flow, cylindrical plasma reactor (10) includes a toroidal waveguide (17) of rectangular cross-section connected to a microwave source (21). One of the reactive species (37) is flowed through the waveguide and pre-ionized, thus, permitting independent control over the activation of both reactive species.

25 Claims, 3 Drawing Figures

METHODS AND APPARATUS FOR GENERATING PLASMAS

RELATED APPLICATION

This is a continuation-in-part of a copending application, Ser. No. 77,220, filed Sept. 20, 1979 now abandoned.

TECHNICAL FIELD

Broadly speaking, this invention relates to plasmas. More particularly, in a preferred embodiment, this invention relates to methods and apparatus for generating plasmas in which at least one of the reactive species is pre-activated in a separate chamber to improve the uniformity and to control the relative concentration of each activated reactive species in a common reactor.

BACKGROUND OF THE INVENTION

Radio frequency power, radial-flow, parallel plate plasma reactors are widely used in the semiconductor industry for both deposition and etching. For example, plasma reactors are widely used to deposit a thin layer of silicon nitride on a silicon wafer by exposing the wafer to a plasma in which the reactive species are silane and ammonia. The silicon nitride film which is deposited on the wafer is then used as a mask in subsequent processing of the wafer.

Unfortunately, in the example mentioned above, the ammonia is found to have a higher activation level than the silane; that is to say, it is more difficult to activate the ammonia than it is to activate the silane. As a result, a considerable degree of non-uniformity is observed in the radial distribution of the metastable, activated nitrogen which is obtained from the ammonia. This, in turn, leads to non-uniform physical properties and non-uniform stochiometry in the deposited silicon nitride. Of course, this phenonmenon is not limited to plasmas derived from ammonia and silane but is observed, in general, whenever two reactive species having differing activation levels are used in either plasma deposition or plasma etching processes.

A paper by Shibagaki, Horiike, Yamazaki and Kashiwagi, which was read before the Symposium of the Electro Chemical Society, held Oct. 9–14, 1977 in Atlanta, Ga., suggested the use of microwave energy to excite nitrogen gas which could then be combined with unexcited silane in a reaction chamber to deposit silicon nitride.

Independently, it occurred to me that microwave energy could also be used to pre-ionize one of the reactive species supplied to a radial-flow reaction chamber thus, in effect, allowing independent control over the activation of *both* species. Advantageously, the species that is pre-ionized is the species having the highest activation level; thus, eliminating the above-discussed problem of non-uniform distribution of the activated species in the plasma.

SUMMARY OF THE INVENTION

In a preferred embodiment, the invention comprises a method of activating at least two reactive species to form a reactive plasma, each of said reactive species having a different activation level. The method comprises the steps of ionizing at least one of the reactive species to form a non-reactive plasma, pre-ionizing the reactive species having the highest activation level to activate the same, and then, flowing the pre-ionized reactive species into the "non-reactive plasma" to convert it into a reactive plasma.

The invention and its mode of operation will be more fully understood from the following detailed description, when taken with the appended drawings, in which:

DETAILED DESCRIPTION

Figure 1:
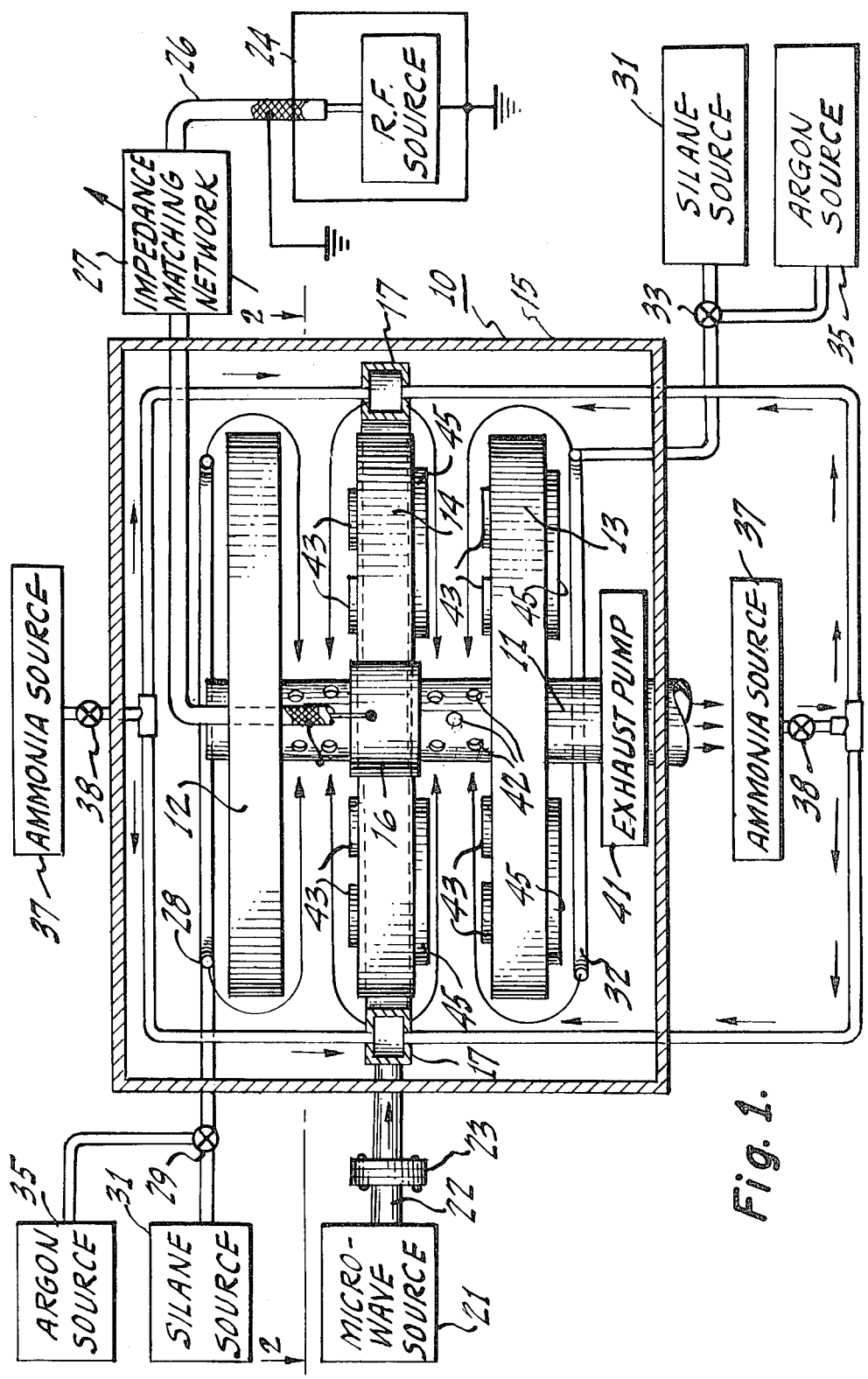
FIG. 1 is a partially cross-sectional and partial schematic view of an illustrative radial-flow reaction chamber according to the invention.

FIG. 1 depicts an illustrative radial-flow, parallel plate reactor according to the invention. The operation of this reactor will be described with reference to a plasma deposition process wherein the reactive species are ammonia and silane and the resulting plasma is used to deposit a film of silicon nitride on a silicon semiconductor wafer. It should be emphasized, however, that the invention is not so limited and may be used, for example, in plasma etching processes as well as in plasma deposition processes. Further, one skilled in the art will appreciate that the invention is not limited to the particular active species described but in general, is applicable to any plasma in which one of the active species has a higher activation energy than the other. It will also be appreciated that the invention is not limited to use in radial-flow, parallel plate reactors but, in its broader aspects, is applicable to any plasma reaction chamber, whatever its configuration. It will still further be appreciated that the invention is not limited to pre-activation by the use of microwaves as any suitable means for causing a discharge may be used provided it can be confined in a volume which is separated from the main reaction chamber.

Figure 2:
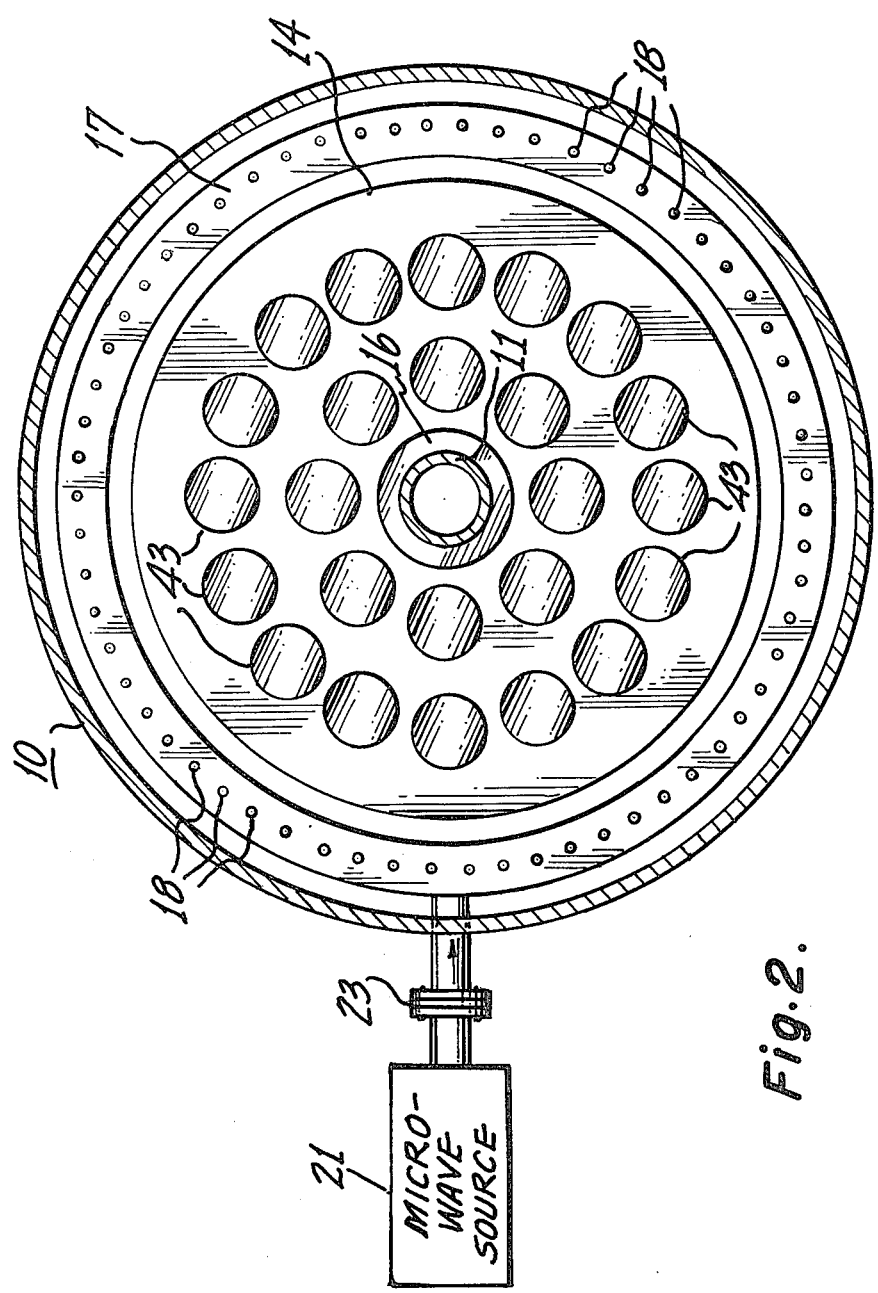
FIG. 2 is a partially isometric view of a portion of the reaction chamber shown in FIG. 1.
Figure 3:
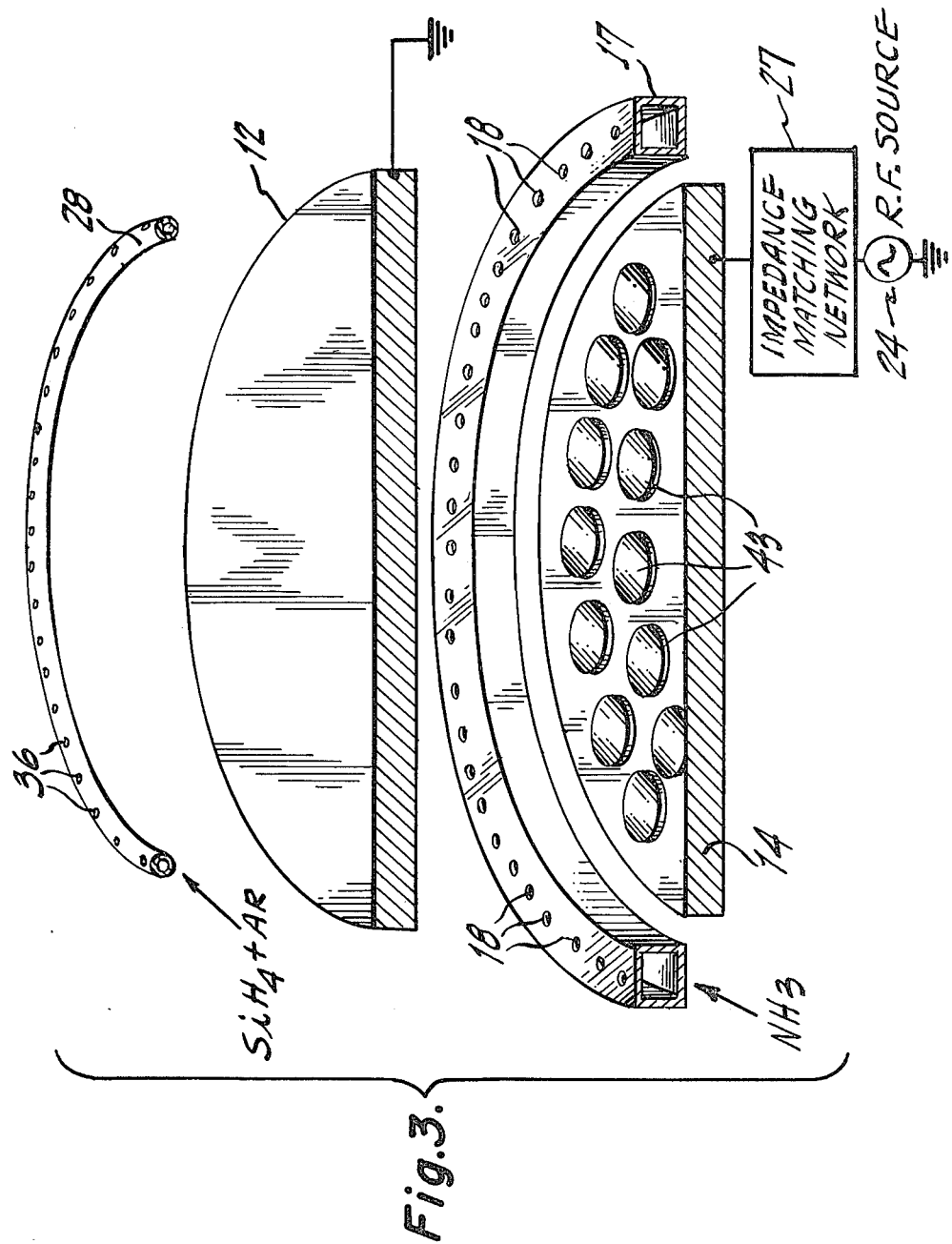
FIG. 3 is a partial plan view of the reactor shown in FIG. 1 illustrating in greater detail the arrangement of the electrodes therein.

As shown in FIG. 1, reactor 10 comprises a hollow, foraminous, cylindrical support 11 having a pair of spaced-apart, upper and lower disk electrodes 12 and 13, respectively secured thereto. A third disk electrode 14 is positioned intermediate electrodes 12 and 13 and is electrically insulated from support 11 by means of a ceramic bushing 16. The electrodes 12, 13 and 14 and the support 11 are all contained within an airtight chamber 15. An annular waveguide 17, of rectangular cross-section, is positioned about the periphery of electrode 14. As best seen in FIGS. 2 and 3, the upper and lower surfaces of waveguide 17 are provided with a plurality of apertures 18, illustratively 0.01 inches in diameter, to permit any reactive gas species introduced into the waveguide to flow into the reaction region of the chamber.

Waveguide 17 is connected to some suitable source of microwave energy 21 by means of a waveguide 22 having a window 23 which is transparent to the microwave radiation but which nevertheless maintains the vacuum within chamber 15 which is necessary to ensure creation of the plasma. Radio-frequency energy from some suitable source 24 is connected to the reaction chamber via a coaxial cable 26 and an impedance-matching network 27. As shown, the ground shield of the coaxial cable is connected to support 11, thence, to electrodes 12 and 13, while the central conductor is connected through an aperture in insulating bushing 16 to the central electrode 14. A toroidal gas supply pipe 28 is positioned immediately above the top surface of electrode 12 and is connected via a valve 29, to some suitable source of silane gas 31 and to some suitable source 35 of an inert carrier gas, such as argon. A similiar supply pipe 32 is positioned immediately below lower electrode 13 and is connected, via a valve 33, to the silane source 31 and the argon source 35. Although shown for convenience as two separate sources in the drawing, one skilled in the art will appreciate that the two silane sources 31 and the two argon sources 35 will actually each comprise a single source in a practical embodiment of the invention.

As best seen in FIG. 3, the gas supply pipes 28 and 32 include a plurality of apertures 36 through which the silane flows into the reaction chamber. Ammonia gas from a source 37 is connected, via a valve 38, to the top and bottom of waveguide 17, at two diametrically-opposed locations, to ensure an even distribution of the gas within the waveguide. Again, although two separate sources are shown in the drawing, one skilled in the art will appreciate that in a practical embodiment, only a single ammonia source would be used. A pump 41 is connected to the lower end of support 11 to exhaust spent gases from the chamber, via the foramina 42 formed therein. A plurality of electrical heating elements 45 are mounted to the lower surfaces of electrodes 13 and 14 to raise the temperature of any workpiece placed thereon during a deposition or etching run. To preserve symmetry, a second pump could be connected to the upper end of support 11; however, this second pump is not shown in FIG. 1 to avoid clutter.

In operation, the semiconductor wafers 43 upon which a film of silicon nitride is to be deposited, are placed on the upper surfaces of electrodes 13 and 14, respectively. If suitable mechanical arrangements are provided, additional wafers may also be mounted on the lower surfaces of electrodes 12 and 14 to effectively double the throughput of the device. The microwave source 21 and radio frequency source 24 are next energized and the valves controlling the argon, silane and ammonia gases turned on, as is the exhaust pump 41. The microwave energy from source 21 that circulates within waveguide 17 ionizes the ammonia gas from source 37 forming the activated species with other unactivated species N*. The activated nitrogen species with other unactivated species then flows out of apertures 18 into the region between electrodes 12 and 14 and electrodes 13 and 14. At the same time, silane from source 31 is fed into the toroidal gas supply pipes 28 and 32 and, likewise, escapes through the apertures 36 into the reaction region. Because of the radio frequency energy supplied from source 24, and the vacuum established by pump 41, a gaseous plasma is struck in the regions between the electrodes. This plasma is almost entirely due to the inert argon gas which is, by far, the largest single constituent in the gaseous mixture. The ionized argon, in turn, excites mostly the silane creating the activated species Si*. The activated species N* and Si* combine depositing a film of silicon nitride on the surfaces of semiconductor wafers 43 which are now at an elevated temperature due to the energy supplied by heaters 45. By varying the amount of power supplied by microwave source 21 and/or RF source 24, a high degree of control can be exercised over the activation of the two reactive species. Put another way, the selective activation of both silicon and nitrogen in a given discharge results in two different radial distributions of Si* and N* which can be independently varied. The resulting SiN film will have a highly satisfactory Si/N ratio and acceptable uniformity over the entire radial position. As a side benefit, the RF power requirements of the radial flow reactor are reduced, which also improves the film quality. In a typical reactor, the RF source supplies in excess of 100 Watts at 13 MhZ while the microwave source supplies in excess of 1,000 Watts of pulsed or CW power in X-band frequencies.

As previously mentioned, the above-described invention is not limited to the deposition of silicon nitride from ammonia and silane. For example, silicon nitride may also be deposited from a mixture of nitrogen gas and silane. If the invention is used for plasma etching, then the reactive species connected to the microwave source might comprise $CF_4$ and the reactive species connected to the gas supply rings 28 and 32 might comprise $O_2$.

As used in the specification and claims, the term "non-reactive plasma" means a plasma which, although it may contain one or more activated species, does not yet contain *all* the activated species necessary to deposit the desired material or perform the desired etch. Also, the term "activated" means an excited state of a neutral species having a long enough lifetime, i.e., metastable state, that the species is capable of reacting with companion activated species.

One skilled in the art may make various changes and substitutions to the layout of parts shown without departing from the spirit and scope of the invention.

What is claimed is:

1. A method of separately activating at least two potentially reactive species to form a reactive plasma when combined, each of said potentially reactive species having a different activation level, said method comprising the steps of:
    (a) forming a non-reactive plasma so as to create therein an activated species of at least one of said potentially reactive species;
    (b) separately activating the other of said potentially reactive species having the higher activation level; and
    (c) flowing the activated species having the higher activation level into said non-reactive plasma to create a reactive plasma.

2. The method according to claim 1 wherein said forming a non-reactive plasma step comprises:
    combining an inert carrier with said at least one potentially reactive species; and then
    ionizing said combination to form said non-reactive plasma.

3. The method according to claim 1 wherein said forming a non-reactive plasma step comprises:
    subjecting said at least one potentially reactive species to an electric field.

4. The method according to claim 2 wherein said forming a non-reactive plasma step comprises:
    subjecting said combination to an electric field.

5. The method according to claims 1 or 2 wherein said separately activating step comprises:
    passing a beam of microwave radiation through said potentially reactive species to form a plasma.

6. The method according to claims 3 or 4 wherein said separately activating step comprises:
    passing a beam of microwave radiation through said potentially reactive species to form a plasma.

7. The method according to claim 1 including the further step of:

selectively controlling the energy supplied (1) to form a non-reactive plasma, and (2) to separately activate the other of said reactive species having the higher activation level, thereby to control the relative concentrations of activated species in said reactive plasma.

8. The method according to claim 2 including the further step of:

selectively controlling the energy supplied (1) to ionize said combination, and (2) to separately activate the other of said reactive species having the higher activation level, thereby to control the relative concentrations of activated species in said reactive plasma.

9. The method according to claims 1, 3 or 7 wherein said at least one potentially reactive species comprises $SiH_4$, the other of said potentially reactive species having the higher activation level comprises $NH_3$, and said method comprises the further step of:

exposing a workpiece to said reactive plasma, whereby said plasma deposits a layer of $Si_3N_4$ onto said workpiece.

10. The method according to claim 9 including the further step of:

heating said workpiece to a temperature in excess of approximately 200° C.

11. The method according to claim 9 wherein said separately activating step comprises:

passing a beam of microwave radiation through the other of said potentially reactive species.

12. The method according to claims 2, 4 or 8 wherein said at least one potentially reactive species comprises $SiH_4$, said inert carrier comprises Ar, the other of said potentially reactive species having the higher activation level comprises $NH_3$, and said method comprises the further step of:

exposing a workpiece to said reactive plasma whereby said reactive plasma deposits a layer of $Si_3N_4$ onto said workpiece.

13. The method according to claim 12 wherein said workpiece is heated to a temperature in excess of approximately 200° C.

14. The method according to claim 12 wherein said separately activating step comprises:

passing a beam of microwave radiation through the other of said potentially reactive species.

15. The method according to claims 1, 3 or 7 wherein said at least one potentially reactive species comprises $O_2$, the other of said potentially reactive species having the higher activation level comprises $CF_4$, and said method comprises the further step of:

exposing a workpiece to said reactive plasma whereby said workpiece is etched by said plasma.

16. The method according to claim 15 wherein said separately activating step comprises:

passing a beam of microwave radiation through the other of said potentially reactive species.

17. Apparatus for separately activating at least two potentially reactive species to form a reactive plasma when combined, each of said potentially reactive species having a different activation level, said apparatus comprising:

means for forming a non-reactive plasma so as to create therein an activated species of at least one of said potentially reactive species;

means for separately activating the other of said potentially reactive species having the higher activation level; and means for flowing the activated species having the higher activation level into said non-reactive plasma to create a reactive plasma.

18. The apparatus according to claim 17 wherein said means for forming a non-reactive plasma comprises:

a sealed reaction chamber;

first and second spaced-apart electrodes positioned in said chamber; and means for establishing an electric field between said first and second electrodes thereby to form a non-reactive plasma.

19. Apparatus for separately activating at least two potentially reactive species to form a reactive plasma when combined, each of said potentially reactive species having a different activation level, said apparatus comprising:

means for forming a non-reactive plasma so as to create therein an activated species of at least one of said potentially reactive species;

means for separately activating the other of said potentially reactive species having the higher activation level, said separately activating means further comprising:

a waveguide positioned within said apparatus, said reactive species having the higher activation level flowing through said waveguide; and a source of a beam of microwave energy connected to said waveguide.

20. The apparatus according to claim 19 wherein said reaction chamber is cylindrical in shape, said first and second electrodes are disc-shaped and are coaxially positioned within said chamber, and said waveguide comprises a toroid of rectangular cross-section coaxial to and aligned with said first disc-shaped electrode.

21. The apparatus according to claim 20 further comprising:

means, intermediate said source of microwave energy and said waveguide for passing microwave energy therethrough but for maintaining the vacuum within said chamber.

22. The apparatus according to claim 21 wherein said means for applying an electric field comprises:

a source of radio frequency energy connected across said first and second electrodes; and impedance-matching means intermediate said radio frequency source and said electrodes.

23. The apparatus according to claim 22 wherein said waveguide includes a plurality of circumferentially disposed apertures to permit the flow of activated reactive species out of said waveguide.

24. The apparatus according to claim 23 further comprising:

at least one ring-shaped supply pipe positioned proximate the other one of said electrodes and connected to a source of said at least one potentially reactive species.

25. The apparatus according to claim 24 including means for exhausting spent gases from said chamber.

* * * * *